(12) United States Patent
Miyachi

(10) Patent No.: US 8,329,481 B2
(45) Date of Patent: Dec. 11, 2012

(54) MANUFACTURING METHOD OF NITRIDE SEMICONDUCTOR LIGHT EMITTING ELEMENTS

(75) Inventor: Mamoru Miyachi, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/369,504

(22) Filed: Feb. 9, 2012

(65) Prior Publication Data

US 2012/0214266 A1      Aug. 23, 2012

(30) Foreign Application Priority Data

Feb. 22, 2011   (JP) ................................ 2011-035864

(51) Int. Cl.
  *H01L 21/00*    (2006.01)
(52) U.S. Cl. ................ 438/27; 438/28; 438/39; 438/40; 438/42; 438/43; 257/99; 257/103; 257/613; 257/E33.068
(58) Field of Classification Search .......................... None
  See application file for complete search history.

(56) References Cited

U.S. PATENT DOCUMENTS

| | | | | |
|---|---|---|---|---|
| 6,744,071 B2 * | 6/2004 | Sano et al. | ........................ | 257/79 |
| 7,436,066 B2 * | 10/2008 | Sonobe et al. | ................ | 257/767 |
| 8,154,035 B2 * | 4/2012 | Fudeta | ............................ | 257/91 |
| 2008/0258165 A1 | 10/2008 | Zimmerman et al. | | |
| 2009/0267096 A1 | 10/2009 | Kim | | |
| 2010/0210046 A1 | 8/2010 | Kao | | |
| 2011/0220928 A1 | 9/2011 | Muramoto | | |
| 2011/0227121 A1 | 9/2011 | Kato et al. | | |

FOREIGN PATENT DOCUMENTS

JP      2006-128710 A     5/2006
WO     2011/120775 A1    10/2011

OTHER PUBLICATIONS

Extended European Search Report (EESR) dated Jul. 25, 2012 (in English) in counterpart European Application No. 12001065.7.

* cited by examiner

*Primary Examiner* — Zandra Smith
*Assistant Examiner* — Khanh Duong
(74) *Attorney, Agent, or Firm* — Holtz, Holtz, Goodman & Chick, PC

(57) ABSTRACT

A manufacturing method of nitride semiconductor light emitting elements, which can reliably form a mechanically stable wiring electrode leading from a light emitting element surface. A structure protective sacrifice layer is formed around a first electrode layer on a device structure layer beforehand, and after separation of the device structure layer into respective portions for the light emitting elements, the resultant is stuck to a support substrate. Subsequently, forward tapered grooves reaching the structure protective sacrifice layer are formed, and the inverse tapered portion formed outward of the forward tapered groove is lifted off in a lift-off step. Thus, an insulating layer is formed on the forward tapered side walls of the light emitting element, and a wiring electrode layer electrically connected to the second electrode layer on the principal surface of the light emitting element is formed on the insulating layer.

6 Claims, 4 Drawing Sheets

Fig. 2
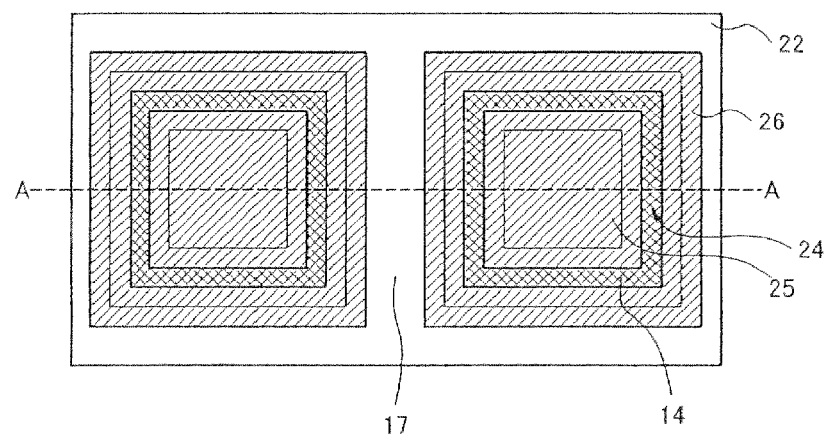
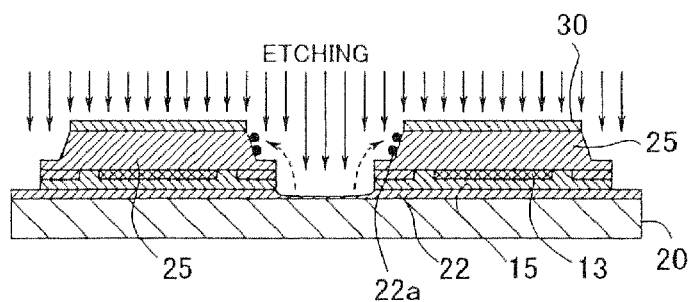
Fig. 3A
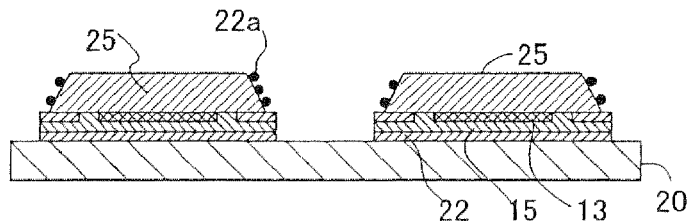
Fig. 3B

MANUFACTURING METHOD OF NITRIDE SEMICONDUCTOR LIGHT EMITTING ELEMENTS

BACKGROUND OF THE INVENTION

1. Field of the Invention

The present invention relates to a manufacturing method of nitride semiconductor light emitting elements.

2. Description of the Related Art

A transparent substrate made of sapphire is usually used as a growth substrate for film formation for nitride semiconductor light emitting elements, and a plurality of nitride semiconductor light emitting elements are formed by film formation on a surface of the sapphire substrate.

Because the heat conductivity of sapphire is as low as 20 W/mK, in order to obtain good heat radiation, the nitride semiconductor side needs to be stuck to a heat sink, a submount, or the like. In this case, light is extracted from the sapphire substrate side, but a lot of light is reflected at the sapphire substrate back surface, resulting in a reduction in light extraction efficiency. Accordingly, a technique has been taken where after another support substrate including, e.g., a package substrate of high heat conductivity is stuck to the nitride semiconductor side, the sapphire substrate is removed by laser lift-off.

When sticking it to another support substrate, the problem occurs that if flat surfaces of large area are stuck together, atmospheric gas or the like is caught between the stuck-together surfaces, resulting in the occurrence of voids.

Further, in the laser lift-off, for example, light having a wavelength shorter than the wavelength 362 nm of the absorption edge of GaN (gallium nitride) is projected from the back side of the sapphire substrate so as to decompose GaN adjacent to the interface with the sapphire substrate into gallium and nitrogen, thereby separating the sapphire substrate. However, where the flat surfaces of large area are stuck together, nitrogen gas occurring in the laser lift-off is less likely to escape to the surrounding area and stays in situ, thus causing another problem that a large impact occurs on the GaN film.

Hence, a technique is carried out where after the nitride semiconductor on the sapphire substrate is divided into individual light emitting elements, the resultant is stuck to another support substrate and where the sapphire substrate is removed by laser lift-off.

In the case of a group-III nitride semiconductor, because its crystal is chemically stable, it is very difficult to wet etch it, and dry etching is used for processing its shape. However, the processed shape in dry etching is usually a forward tapered shape, and hence if a nitride semiconductor is divided into individual elements and then stuck to another support substrate as in the above technique, the side walls of the elements will have an inverse tapered shape.

Hence, it is difficult to form a feeder line leading to the surface (usually an n-type GaN surface) from which the sapphire substrate is removed, on those side walls.

Accordingly, there are a technique in which feeder lines are provided by wire-bonding and a technique in which with a flip-chip structure (where an n-electrode and a p-electrode are arranged on the same side) being used for the electrode structure, it is aligned with a package substrate having a feeder line pattern formed beforehand so as to stick them together. Refer to Japanese Patent Kokai No. 2006-128710 (Patent Literature 1).

SUMMARY OF THE INVENTION

However, with the method of electrical connection by wire-bonding, there is the problem that the breaking of a wire or the peeling off of a joint may occur due to a mechanical impact or the like. Further, in a light emitting device that performs wavelength conversion using a fluorescent substance, with the interference of wires, it is difficult to stably form a fluorescent substance layer to be uniform on the upper surface of a chip.

Further, where the flip-chip type is used, precise alignment is needed when sticking them together, thus causing the problem that the process is complicated.

In forming mechanically stable wiring electrodes by a simple and convenient process, the technique is effective where the side walls of light emitting elements are processed to be in a forward tapered shape and where a wiring electrode layer is deposited on the forward tapered side walls, but when inverse tapered side wall portions are etched, an exposed metal layer on the support substrate that is around them is also etched at the same time. If the exposed metal layer in this region is etched, then it is difficult to form wiring electrodes electrically connected to electrodes (usually p-electrodes) on the sticking-together surface side.

Further, in the etching process, metal pieces from regions surrounding the elements such as the metal layer on the support substrate or etching by-products may stick to side walls of the light emitting elements, resulting in the problem of electrically short-circuiting a p-type layer and an n-type layer.

The present invention has been made in view of the above facts, and an object thereof is to provide a nitride semiconductor light emitting element manufacturing method which can reliably form a mechanically stable wiring electrode leading from the light emitting element surface from which the growth substrate for film formation is removed.

According to the present invention, there is provided a manufacturing method of nitride semiconductor light emitting elements, which forms a device structure layer for a plurality of light emitting elements on a growth substrate for film formation and, after separating the device structure layer into respective portions for the light emitting elements, sticks a support substrate to the device structure layer side and removes the growth substrate. The manufacturing method includes a step of forming the device structure layer on the growth substrate; a step of forming a first electrode layer in positions respectively corresponding to the plurality of light emitting elements on a surface of the device structure layer; a step of forming a structure protective sacrifice layer around the first electrode layer on the surface of the device structure layer; an element isolating step of forming element isolating grooves in the device structure layer so as to separate the device structure layer into respective portions for the light emitting elements; a bonding step of, after the element isolating step, sticking the support substrate to the device structure layer side; a step of, after the bonding step, removing the growth substrate; a forward tapered groove forming step of forming forward tapered grooves reaching the structure protective sacrifice layer in the device structure layer, thereby separating the device structure layer into the light emitting elements having the first electrode layer and inverse tapered portions on the structure protective sacrifice layer; a lift-off step of etching the structure protective sacrifice layer, thereby lifting off the inverse tapered portions; a step of forming a second electrode layer on an exposed surface of the device structure layer exposed by the removal of the growth substrate; and a wiring electrode layer forming step of forming an insulating layer on side walls of the light emitting elements and forming a wiring electrode layer electrically connected to the second electrode layer on the insulating layer.

According to the manufacturing method of nitride semiconductor light emitting elements of the present invention, a structure protective sacrifice layer is formed around the first electrode layer on the device structure layer beforehand, and after the device structure layer is separated into respective portions for the light emitting elements, the resultant is stuck to a support substrate. In the subsequent forward tapered groove forming step, forward tapered grooves reaching the structure protective sacrifice layer are formed, at which time the inverse tapered portion is formed outward of the forward tapered groove and then lifted off in the lift-off step. Hence, the side walls of the light emitting element become forward tapered toward the support substrate side. Thus, an insulating layer is formed on the forward tapered side walls of the light emitting element, and a wiring electrode layer electrically connected to the second electrode layer on the principal surface of the light emitting element is formed on the insulating layer, and thereby the mechanically stable wiring electrode layer can be reliably formed.

BRIEF DESCRIPTION OF THE DRAWINGS

FIG. 2 is a plan view showing the principal surface side of light emitting elements after a forward tapered groove forming step;

FIGS. 3A and 3B are cross-sectional views showing how etching by-products due to etching stick to side walls of light emitting elements;

DETAILED DESCRIPTION OF THE INVENTION

Embodiments of the present invention will be described below in detail with reference to the drawings.

Figure 1:
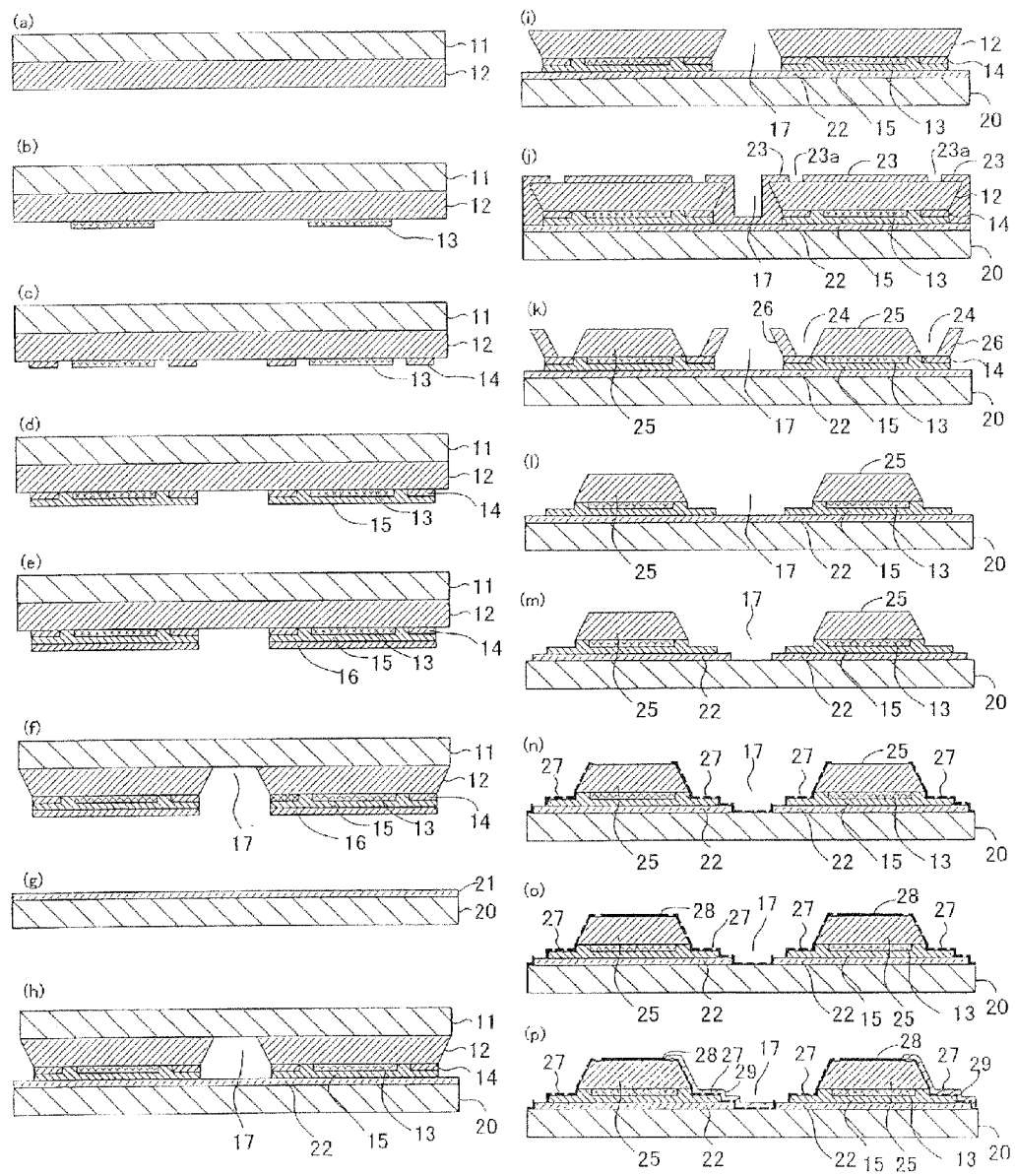
FIG. 1 is a cross-sectional view showing the manufacturing method according to Embodiment 1 of the present invention.

FIG. 1 is a cross-sectional view showing the manufacturing method of nitride semiconductor light emitting elements that is Embodiment 1 of the present invention. Reference symbols (a) to (p) in FIG. 1 denote process steps (a) to (p) described below. The present embodiment shows the case where two light emitting elements are produced on a substrate.

(a) Device Structure Layer Forming Step

In the device structure layer forming step, a transparent substrate (growth substrate) 11 made of sapphire is prepared, and a device structure layer 12 composed of nitride-based semiconductors is formed on the substrate 11 by an MOCVD (metal organic chemical vapor deposition) method. The device structure layer 12 is formed of an n-type GaN layer of 5 μm thickness, a multi-quantum well light emitting layer including an InGaN quantum well layer, and a p-type GaN layer of 0.5 μm thickness (none of them shown) laid one over another in that order. The sapphire of the substrate 11 has the quality of being transparent to light having a wavelength of 362 nm equal to the absorption edge wavelength of GaN, and a material other than a sapphire substrate may be used such as spinel, SiC, or ZnO.

(b) First Electrode Layer Forming Step

In the first electrode layer forming step, an Ag layer of 200 nm thickness is formed on the surface of the device structure layer 12 by an electron beam evaporation method, and the Ag layer is patterned by a photolithography method to form a first electrode layer 13. The first electrode layer 13 is placed in a position corresponding to each light emitting element on the surface of the device structure layer 12.

(c) Structure Protective Sacrifice Layer Forming Step

In the structure protective sacrifice layer forming step, a structure protective sacrifice layer 14 made of $SiO_2$ (silicon dioxide) of the same thickness as that of the first electrode layer 13 is formed around the first electrode layer 13 on the device structure layer 12 using a sputtering method. The structure protective sacrifice layer 14 is exposed by etching in a forward tapered groove forming step (k) described later, and if a material of high conductivity such as metal is used for it, then conductive etching by-products will stick to etched side walls to electrically short-circuit the p-type GaN layer and the n-type GaN layer. Hence, it is desirable that an insulating material is used for this layer, and a material such as silicon nitride, aluminum nitride, zirconia, or alumina other than silicon dioxide can be used.

Further, the structure protective sacrifice layer 14 functions as a sacrifice layer in a lift-off step (l), and hence is formed at least in positions where forward tapered grooves are to be formed in the forward tapered groove forming step (k). That is, the sacrifice layer 14 is formed in such positions that at least its parts will become exposed at the bottoms of the forward tapered grooves formed in the forward tapered groove forming step (k).

Further, the structure protective sacrifice layer 14 functions as a sacrifice layer in the lift-off step (l) as mentioned above, and hence is more desirably made of silicon dioxide that can be easily wet etched with buffer hydrofluoric acid (BHF).

(d) Diffusion Preventing Layer Forming Step

In the diffusion preventing layer forming step, a diffusion preventing layer 15 made of TiW of 300 nm thickness is formed in areas including the upper surface of the first electrode layer 13 and the upper surfaces of the structure protective sacrifice layer 14 using a sputtering method. The diffusion preventing layer 15 is for preventing the diffusion of material used for the first electrode layer 13, and if the material of the first electrode layer 13 includes Ag, then Ti, W, Pt, Pd, Mo, Ru, Ir, or an alloy thereof can be used.

(e) First Adhesive Layer Forming Step

In the first adhesive layer forming step, a first adhesive layer 16 made of Au of 200 nm thickness is formed on the diffusion preventing layer 15 using an electron beam evaporation method.

(f) Device Structure Layer Separating Step

In the device structure layer separating step, element isolating grooves 17 are formed in the device structure layer 12 so as to reach the substrate 11 by using a resist mask and a dry etching method using chlorine gas. The side surfaces of the device structure layer 12 isolated by the element isolating groove 17 are forward tapered toward the substrate 11. The element isolating grooves 17 are grooves which divide the device structure layer 12 on the substrate 11 into a plurality of light emitting elements, and are formed like a lattice as seen from above the device structure layer 12. Note that the device structure layer separating step (f) does not necessarily need to be performed after the diffusion preventing layer forming step (d), but may be performed between any steps of from the device structure layer forming step (a) to the diffusion preventing layer forming step (d).

(g) Second Adhesive Layer Forming Step

In the second adhesive layer forming step, a support substrate 20 made of Si is prepared, and a second adhesive layer 21 made of Au—Sn (Sn: 20 wt %) of 1 μm thickness is formed on the support substrate 20 using a resistance heating evaporation method. A material having high thermal conductivity of which the coefficient of thermal expansion is close to $7.5 \times 10^{-6}$/K of sapphire and $5.6 \times 10^{-6}$/K of GaN is preferable as that of the support substrate 20. A material other than Si can be used such as AlN (aluminum nitride), Mo (molybdenum), W (tungsten), or CuW (copper-tungsten alloy). As materials for the first adhesive layer 16 and the second adhesive layer 21, metal including Au—Sn, Au—In, Pd—In, Cu—In, Cu—Sn, Ag—Sn, Ag—In, Ni—Sn, or the like, for which eutectic bonding is possible, or metal including Au, for which diffusion bonding is possible, can be used.

(h) Wafer Bonding Step

In the wafer bonding step, the first adhesive layer 16 and the second adhesive layer 21 are put in contact and heated to 300° C. under a pressure of 3 MPa and held in these conditions for 10 minutes, and then cooled down to room temperature, thereby performing eutectic bonding. That is, the support substrate 20 is stuck thereto via a metal film by the mixing diffusion of the first adhesive layer 16 and the second adhesive layer 21 made of metal material capable of eutectic bonding. In FIG. 1, the resultant of the eutectic bonding of the first adhesive layer 16 and the second adhesive layer 21 is indicated as a bonding layer 22.

(i) Transparent Substrate Separating Step

In the transparent substrate separating step, UV excimer laser light is irradiated onto the sapphire substrate 11 from the back side to heat and decompose part of the device structure layer 12 adjacent to the interface with the substrate 11, and thus the substrate 11 is separated. The side walls of the device structure layer 12 isolated by the element isolating groove 17 are inverse tapered toward the bonding layer 22.

(j) Resist Mask Forming Step

In the resist mask forming step, a resist mask 23 is formed that masks the element isolating groove 17 and regions other than openings 23a extending over a region of 10 μm width from a position 10 μm away from the element isolating groove 17 on the transparent substrate removed surface (exposed surface) of the device structure layer 12.

Although in the present embodiment the resist mask is formed as a protective mask, an appropriate material such as an insulating layer mask made of $SiO_2$ or a metal mask can be selected as the protective mask of the present invention, not being limited to a resist.

(k) Forward Tapered Groove Forming Step

In the forward tapered groove forming step, parts of the device structure layer 12 not masked by the resist mask 23 are etched by a dry etching method using chlorine gas to form forward tapered grooves 24 reaching the structure protective sacrifice layer 14. By this means, a light emitting element 25 is formed inward of the forward tapered groove 24, and an inverse tapered portion 26 is formed outward of the forward tapered groove 24. After the etching, the resist mask 23 is removed.

In the forward tapered groove forming step, the four side walls of each light emitting element 25 are formed by forming the forward tapered groove 24 in a ring shape so that the light emitting element 25 has a quadrilateral principal surface. FIG. 2 is a plan view of the device structure layer 12 side, that is, the principal surface side of the light emitting element 25 as seen from above it. As seen from FIG. 2, the forward tapered groove 24 is formed in a quadrilateral ring shape around the light emitting element 25 having the quadrilateral principal surface, and the inverse tapered portion 26 is formed in a quadrilateral ring shape around the forward tapered groove 24. The cross-section along line A-A in FIG. 2 is shown, in cross-sectional view, in part (k) of FIG. 1 showing the forward tapered groove forming step.

(l) Lift-Off Step

In the lift-off step, the structure protective sacrifice layer 14 is wet etched with buffer hydrofluoric acid, and thus the inverse tapered portion 26 is lifted off.

(m) Bonding Layer Separation Step

Part of the bonding layer 22 exposed in the element isolating groove 17 is etched by a dry etching method using argon gas, and a plurality of light emitting elements 25 are electrically insulated from each other.

(n) Protective Film Forming Step

In the protective film forming step, a protective film (insulating layer) 27 made of $SiO_2$ is formed entirely over the surfaces of the elements formed on the substrate 20 up to the step (m). Further, parts of the protective film 27 on the device structure layer 12 are etched with buffer hydrofluoric acid to make parts of the device structure layer 12 (the principal surface of each light emitting element 25) exposed.

(o) Second Electrode Layer Forming Step

In the second electrode layer forming step, a Ti layer of 10 nm thickness and an Al layer of 300 nm thickness are laid one over the other in that order on the surfaces, exposed by the removal of the substrate 11 in the transparent substrate separating step (i), of the device structure layer 12 by an electron beam evaporation method and are patterned by a photolithography method to form a second electrode layer 28.

(p) Wiring Electrode Forming Step

In the wiring electrode forming step, a wiring electrode layer 29 made of Au of 1 μm thickness is formed on regions including the second electrode layer 28 and the protective layer 27 by an electron beam evaporation method.

As such, in Embodiment 1, the manufacturing method is carried out where after in the device structure layer separating step (f) the device structure layer is separated into respective portions for light emitting elements, the resultant is stuck to the support substrate 20 in the wafer bonding step (h). In the manufacturing method of Embodiment 1, the structure protective sacrifice layer 14 is formed beforehand around the first electrode layer 13 on the device structure layer 12, and subsequently in the forward tapered groove forming step (k) the forward tapered groove 24 reaching the structure protective sacrifice layer 14 is formed, at which time the inverse tapered portion 26 is formed outward of the forward tapered groove 24 and then lifted off in the lift-off step (l). Hence, the side walls of the light emitting element 25 become forward tapered toward the support substrate 20 side. Thus, the protective layer 27 is formed on the forward tapered side walls of the light emitting element 25, and the wiring electrode layer 29 electrically connected to the second electrode layer 28 on the principal surface of the light emitting element 25 is formed on the protective layer 27, and thereby the mechanically stable wiring electrode layer 29 can be reliably formed. Further, there is the advantage that the electrical connection method using wire bonding weak in mechanical strength or the method where a flip-chip structure is used for the electrode structure, resulting in the process being complicated, need not be used.

Further, in the manufacturing method of Embodiment 1, at dry etching for making the side walls of the light emitting element 25 forward tapered, etching by-products are prevented from sticking to the side walls of the light emitting element 25. Hence, the cause of a short-circuit, for example, between the p-type layer and the n-type layer does not occur, and the yield when manufacturing nitride semiconductor light emitting elements can be improved.

FIG. 3A shows the case where the side walls of the light emitting element 25 are etched to be forward tapered without forming the forward tapered groove 24 described above. In this etching, although the principal surface of the light emitting element 25 is usually masked by a resist mask 30, etching by-products including metal occur due to the etching of the exposed part of the bonding layer 22, and pieces of them fly as shown in FIG. 3A and stick to side walls of the light emitting elements 25 as shown in FIG. 3B. However, in the manufacturing method of Embodiment 1, as described above, the side walls of the light emitting element 25 are protected by the inverse tapered portion 26, and thus etching by-products sticking to the side walls of the light emitting element 25 is prevented.

Figure 4:
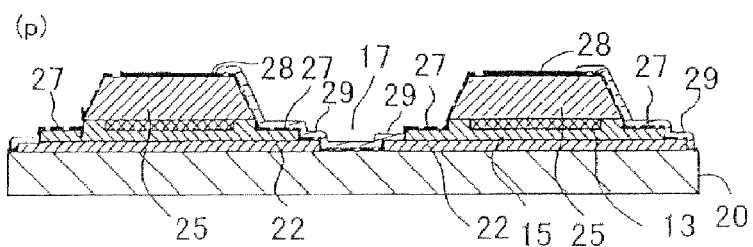
FIG. 4 is a cross-sectional view showing the manufacturing method according to Embodiment 2 of the present invention.

FIG. 4 shows the wiring electrode forming step that is a part of the manufacturing method of nitride semiconductor light emitting elements that is Embodiment 2 of the present invention and is marked with the same reference symbol (p) as in FIG. 1. In the wiring electrode forming step (p) of Embodiment 2, the wiring electrode layer 29, which is formed over one light emitting element 25 in the aforementioned wiring electrode forming step (p) of Embodiment 1, is formed to extend partly over the portion of the bonding layer 22 electrically connected to the first electrode layer 13 of an adjacent light emitting element 25. Since the other steps of Embodiment 2 are the same as those of Embodiment 1, detailed description thereof is omitted here.

In the manufacturing method of Embodiment 2, an electrical connection between adjacent light emitting elements 25 is formed by the wiring electrode layer 29. Hence, a light emitting device comprising a plurality of light emitting elements can be easily configured.

Figure 5:
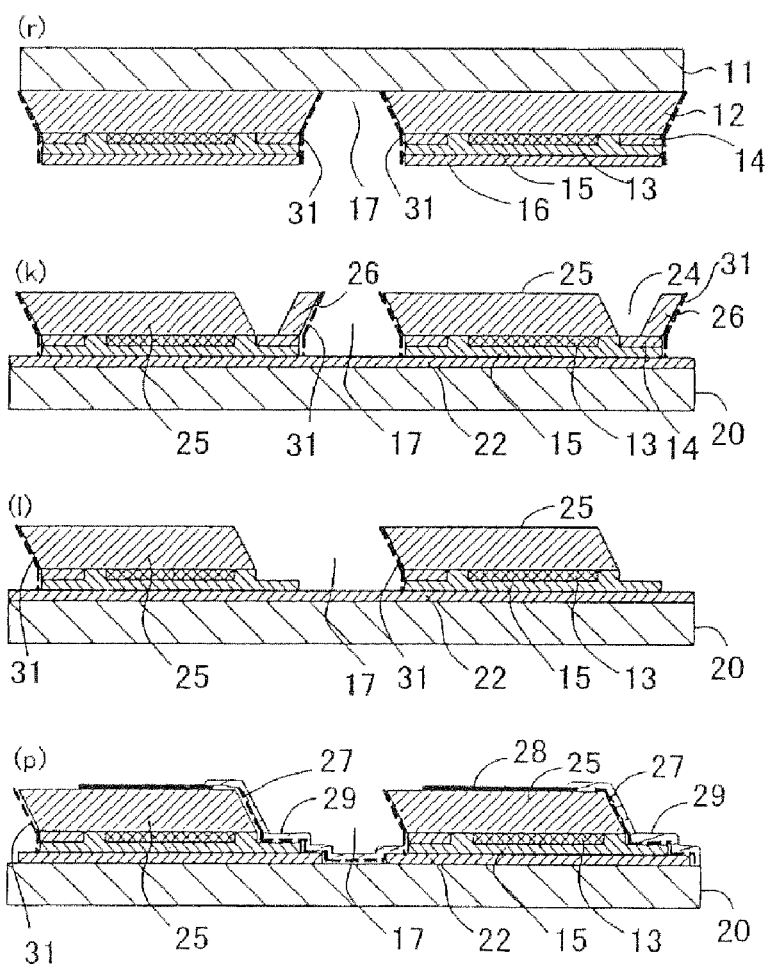
FIG. 5 is a cross-sectional view showing the manufacturing method according to Embodiment 3 of the present invention.

In the manufacturing method of nitride semiconductor light emitting elements that is Embodiment 3 of the present invention, as shown in part (r) of FIG. 5, after the completion of the device structure layer separating step (f), a side wall protective layer forming step (r) is performed. In the side wall protective layer forming step (r), a side wall protective layer 31 made of SiO$_2$ of 200 nm thickness is formed on the side walls of the element isolating groove 17. The side wall protective layer forming step (r) is performed to prevent fused metal from sticking to the side walls of the element isolating groove 17 to electrically short-circuit the p-type GaN layer and the n-type GaN layer in the eutectic bonding process of the subsequent wafer bonding step (h) and the separating process of the substrate 11 in the transparent substrate separating step (i).

Figure 6:
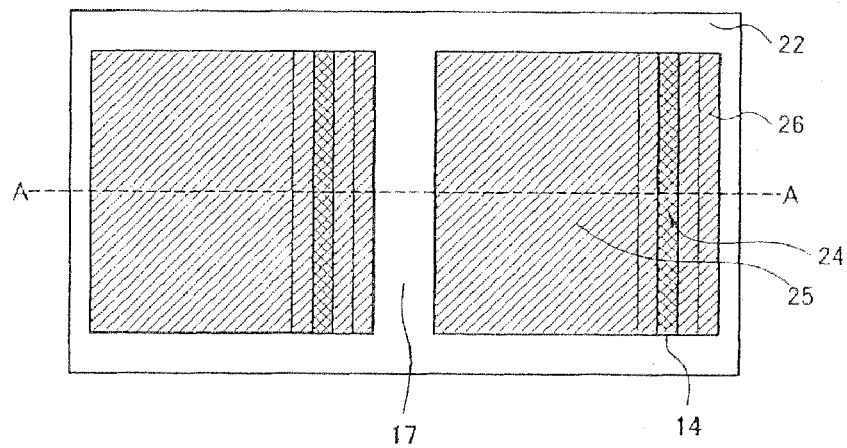
FIG. 6 is a plan view showing the principal surface side of light emitting elements after the forward tapered groove forming step in Embodiment 3.

When the side wall protective layer forming step (r) has been performed, the forward tapered groove forming step (k) is performed as shown in part (k) of FIG. 5. In this forward tapered groove forming step (k), a forward tapered groove 24 reaching the structure protective sacrifice layer 14 is formed for only one side wall of the light emitting element 25. When the device structure layer 12 side is viewed from above as shown in FIG. 6, a side wall in the same direction of the four outer side walls of each light emitting element 25 is formed by forming a forward tapered groove 24 straight. The cross-section along line A-A in FIG. 6 is shown, in cross-sectional view, in part (k) of FIG. 5 showing the forward tapered groove forming step.

After the forward tapered grooves 24 are formed in this way, the lift-off step (l) and the wiring electrode forming step (p) are performed as shown in parts (l) and (p) of FIG. 5. In part (k) of FIG. 5, for the side walls having no forward tapered groove 24 formed, a resist (not shown) is formed covering the side wall protective layer 31 so that in the lift-off step (l) the side wall protective layer 31 and the structure protective sacrifice layer 14 in the resist-covered area are protected from being removed. The resist (not shown) covering the side wall protective layer 31 is removed after the lift-off, and the side wall protective layer 31 becomes exposed again as shown in part (l) of FIG. 5.

Figure 7:
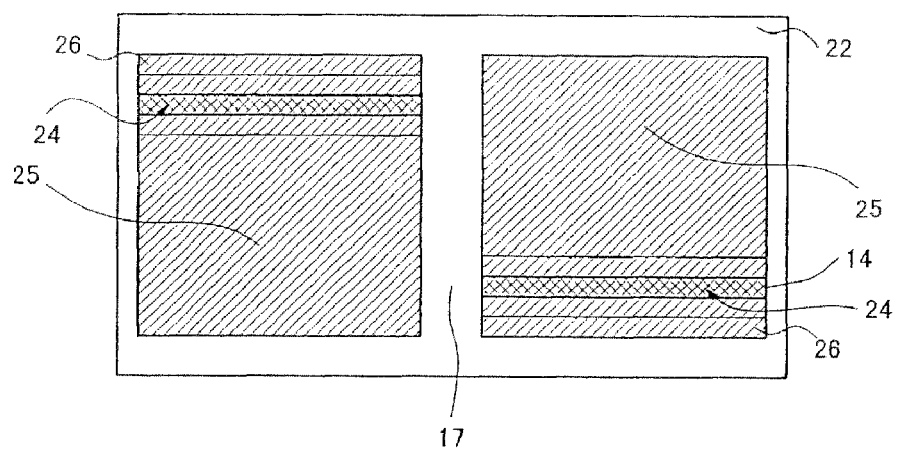
FIG. 7 is a plan view showing an example where one side wall of each of adjacent light emitting elements, the ones being in mutually opposite directions, is forward tapered.

Although in the forward tapered groove forming step (k) of FIG. 5 each forward tapered groove 24 is formed to form only one side wall in the same direction of the four side walls of a light emitting element 25, the forward tapered grooves 24 do not necessarily need to be formed respectively for side walls in the same direction, but one of the four side walls of each of adjacent light emitting elements 25, where the ones are in mutually opposite directions, may be formed by forming a forward tapered groove 24 as shown in FIG. 7.

Figure 8:
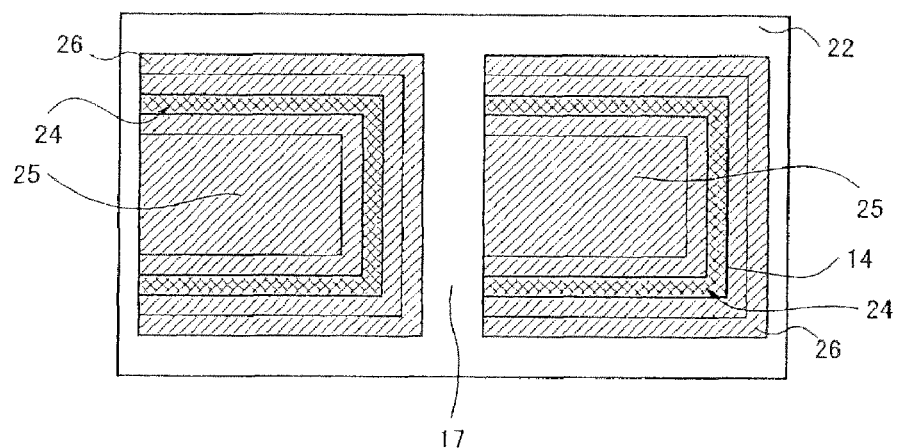
FIG. 8 is a plan view showing an example where three side walls of each light emitting element are forward tapered.

The side walls other than the side wall formed by a forward tapered groove from among the four side walls of each light emitting element 25 are formed by forming an element isolating groove. That is, in order to make at least one side wall of the four outer side walls of each light emitting element 25 forward tapered, forward tapered grooves may be formed. FIG. 8 shows an example where forward tapered grooves 24 are formed to form three forward tapered side walls of each light emitting element 25.

Further, if at least one side wall facing an element isolating groove of each light emitting element is made in an inverse tapered shape, then light travelling in an in-plane direction in the light emitting element is reflected upward by the inverse tapered side wall and efficiently extracted out of the light emitting element. Thus, a reduction in the amount of light in and around the area between light emitting elements can be suppressed, and hence with a light emitting device comprising a plurality of light emitting elements, the problem that brightness unevenness occurs due to a reduction in the amount of light in the area between light emitting elements and the problem of color unevenness in a light emitting device performing wavelength conversion using a fluorescent substance can be solved.

In the above embodiments, the method of manufacturing two light emitting elements is described, but not being limited to this, the present invention can be applied to the case of manufacturing three or more light emitting elements on a substrate.

Further, the present invention is suitable as a method of manufacturing a light emitting diode such as a blue light emitting diode or a while light emitting diode as a light emitting element.

This application is based on Japanese Patent Application No. 2011-035864 which is incorporated herein by reference.

What is claimed is:

1. A manufacturing method of nitride semiconductor light emitting elements, which forms a device structure layer for a plurality of light emitting elements on a growth substrate for film formation and, after separating said device structure layer into respective portions for the light emitting elements, sticks a support substrate to said device structure layer side and removes said growth substrate, said manufacturing method including:

a step of forming said device structure layer on said growth substrate;

a step of forming a first electrode layer in positions respectively corresponding to said plurality of light emitting elements on a surface of said device structure layer;

a step of forming a structure protective sacrifice layer around said first electrode layer on the surface of said device structure layer;

an element isolating step of forming element isolating grooves in said device structure layer so as to separate said device structure layer into respective portions for the light emitting elements;

a bonding step of, after said element isolating step, sticking said support substrate to said device structure layer side;

a step of, after said bonding step, removing said growth substrate;

a forward tapered groove forming step of forming forward tapered grooves reaching said structure protective sacrifice layer in said device structure layer, thereby separating said device structure layer into the light emitting elements having said first electrode layer and inverse tapered portions on said structure protective sacrifice layer;

a lift-off step of etching said structure protective sacrifice layer, thereby lifting off said inverse tapered portions;

a step of forming a second electrode layer on an exposed surface of said device structure layer exposed by the removal of said growth substrate; and a wiring electrode layer forming step of forming an insulating layer on side walls of said light emitting elements and forming a wiring electrode layer electrically connected to said second electrode layer on said insulating layer.

2. A manufacturing method according to claim 1, further including:

a mask forming step of forming a mask having openings in forming positions for said forward tapered grooves on said exposed surface of said device structure layer, the mask protecting said exposed surface of said device structure layer, except said openings, and said element isolating grooves, wherein in said forward tapered groove forming step, the forward tapered grooves are formed by etching through said openings.

3. A manufacturing method according to claim 1, further including:

a step of forming a first adhesive layer over a surface of said device structure layer on which said structure protective sacrifice layer and said first electrode layer are formed; and a step of forming a second adhesive layer on said support substrate, wherein in said bonding step, said first adhesive layer and said second adhesive layer are put in contact, and by eutectic bonding of said first adhesive layer and said second adhesive layer, said support substrate is stuck to said device structure layer.

4. A manufacturing method according to claim 3, further including:

a step of etching parts of said second adhesive layer exposed in said element isolating grooves so as to electrically insulate said plurality of light emitting elements from each other.

5. A manufacturing method according to claim 1, wherein in said forward tapered groove forming step, at least one of four side walls of each of said light emitting elements is formed by forming said forward tapered groove so that each said light emitting element has a quadrilateral principal surface.

6. A manufacturing method according to claim 1, wherein in said wiring electrode layer forming step, said wiring electrode layer is electrically connected to a portion of said first electrode layer of a light emitting element adjacent to a light emitting element having its portion of said second electrode layer electrically connected to said wiring electrode layer.

* * * * *